(12) United States Patent
Hamada et al.

(10) Patent No.: US 6,580,601 B2
(45) Date of Patent: Jun. 17, 2003

(54) SOLID ELECTROLYTE CAPACITOR AND METHOD FOR MANUFACTURING THE SAME

(75) Inventors: Takahiro Hamada, Hirakata (JP); Emiko Igaki, Amagasaki (JP); Masakazu Tanahashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/284,658

(22) Filed: Oct. 30, 2002

(65) Prior Publication Data

US 2003/0081373 A1 May 1, 2003

(30) Foreign Application Priority Data

Oct. 30, 2001 (JP) .......................................... 2001-332191
Jun. 7, 2002 (JP) .......................................... 2002-167800

(51) Int. Cl.⁷ ................................................ H01G 9/00
(52) U.S. Cl. ........................ 361/523; 361/525; 361/526; 29/25.03
(58) Field of Search ................................ 361/523, 524, 361/526, 528, 532; 29/25.03

(56) References Cited

U.S. PATENT DOCUMENTS 5,621,608 A * 4/1997 Arai et al. .................. 361/525
6,110,234 A * 8/2000 Sakata et al. .............. 29/25.03
6,185,091 B1   2/2001 Tanahashi et al.
6,224,639 B1 * 5/2001 Hamada et al. ............. 29/25.03
6,262,878 B1   7/2001 Shirashige et al.

FOREIGN PATENT DOCUMENTS

| JP | 61-183524   | 11/1986 |
| JP | 6-267802    | 9/1994  |
| JP | 11-288846   | 10/1999 |
| JP | 2000-058376 | 2/2000  |
| JP | 2001-006978 | 1/2001  |
| JP | 2001-155952 | 6/2001  |

\* cited by examiner

Primary Examiner—Anthony Dinkins
(74) Attorney, Agent, or Firm—Merchant & Gould P.C.

(57) ABSTRACT

A solid electrolyte capacitor includes an anode made of a valve metal on whose surface a dielectric oxide film layer is formed, a solid electrolyte layer formed on the dielectric oxide film, a cathode layer formed on the solid electrolyte layer, a cathode contact terminal electrically connected to the cathode layer, and an anode contact terminal electrically connected to the anode layer. The cathode layer includes a carbon layer containing carbon particles, and a conductive paste layer containing conductive metal particles and having numerous pores, formed in that order from the solid electrolyte layer side. The solid electrolyte capacitor further includes a conductive polymer layer formed through the numerous pores of the conductive paste layer and connecting the carbon particles of the carbon layer and the conductive metal particles of the conductive paste layer. Thus, the interface resistance between the carbon layer and the conductive paste layer is lowered, and a solid electrolyte capacitor with small equivalent series resistance can be provided.

23 Claims, 8 Drawing Sheets

SOLID ELECTROLYTE CAPACITOR AND METHOD FOR MANUFACTURING THE SAME

FIELD OF THE INVENTION

The present invention relates to solid electrolyte capacitors with improved contact between carbon particles and conductive metal particles, as well as to methods for manufacturing the same.

BACKGROUND OF THE INVENTION

The following is an explanation of a method for manufacturing a conventional solid electrolyte capacitor. First, a dielectric made of an oxide film is formed on the surface of a porous anode made of valve metal. A solid electrolyte is formed on this oxide film. After this, a cathode layer made of a carbon layer and a silver paste layer is formed, forming an internal element of a solid electrolyte capacitor. On the anode side, the lead of the anode is joined to an anode contact terminal, and on the cathode side, the internal element of the solid electrolyte capacitor is connected to a cathode contact terminal with a silver adhesive, and then the entire arrangement is molded with a packaging resin, thus obtaining a solid electrolyte capacitor.

In the above-described solid electrolyte capacitor, there is the problem that the equivalent series resistance (ESR) in the high-frequency range of the solid electrolyte capacitor cannot be decreased below a certain value, even when using manganese dioxide or a conductive polymer with an even higher conductivity as the solid electrolyte.

In JP 2858075B, manganese dioxide is used for the solid electrolyte. In this publication, the surface of the manganese dioxide is provided with protrusions and depressions, so that the surface of the carbon layer formed on the manganese is also provided with protrusions and depressions, and there is the problem that the contact area between the carbon layer and the silver paste layer is only at the protrusions of the carbon layer, so that the actual contact area becomes small. To address this problem, a conductive polymer layer is formed on the carbon layer by electrolytic polymerization. By forming the conductive polymer in the depressions of the carbon layer, the effective contact area of the carbon layer and the silver paste layer is increased, and a smaller equivalent series resistance in the high-frequency range is attained.

Furthermore, in JP H09-129512A, manganese dioxide is used for the solid electrolyte. As in the previous case, the surface of the manganese dioxide layer is provided with protrusions and depressions, so that the surface of the carbon layer formed on the manganese dioxide layer also is provided with protrusions and depression, and there is the problem that the effective contact area of the carbon layer and the silver paste layer becomes small. To address this problem, a metal layer made of a fine powder of gold, silver or palladium, or a mixture thereof is formed on the carbon layer, thus increasing the effective contact area of the carbon layer and the silver paste layer, and attaining a smaller equivalent series resistance in the high-frequency range.

Furthermore, in JP 2765462B, a conductive polymer is used for the solid electrolyte. In this publication, the surface of the conductive polymer layer becomes smooth, so that there is the problem that the adhesiveness between the conductive polymer layer and the carbon layer becomes poor. To address this, the surface of the conductive polymer layer is provided with protrusions and depressions, strengthening the adhesiveness between the conductive polymer layer and the carbon layer, and attaining a smaller equivalent series resistance.

However, in the above-described capacitors, the carbon particles or metal particles and the silver particles are in point contact between the carbon layer or metal layer on the carbon layer and the silver paste layer, so that there is the problem that the interface resistance between the carbon layer or metal layer on the carbon layer and the silver paste layer cannot be lowered, and the equivalent series resistance is large. In particular in view of the higher speeds of recent digital devices, there is a demand for capacitors with an extremely small equivalent series resistance, and attention has focused on the interface resistance at this portion.

SUMMARY OF THE INVENTION

In view of the foregoing, it is an object of the present invention to solve the problem of point contact between the carbon particles and the conductive metal particles by forming, in that order, a solid electrolyte layer, a carbon layer, and a conductive paste layer having numerous pores, and then forming a conductive polymer layer reinforcing the electric contact between the carbon particles of the carbon layer and the conductive metal particles of the conductive paste layer, which were in point contact.

That is to say, a solid electrolyte capacitor in accordance with the present invention includes an anode made of a valve metal on whose surface a dielectric oxide film layer is formed, a solid electrolyte layer formed on the dielectric oxide film, a cathode layer formed on the solid electrolyte layer, a cathode contact terminal electrically connected to the cathode layer, and an anode contact terminal electrically connected to the anode layer. The cathode layer includes a carbon layer containing carbon particles, and a conductive paste layer containing conductive metal particles and having numerous pores, formed in that order from the solid electrolyte layer side. The solid electrolyte capacitor further includes a conductive polymer layer formed through the numerous pores of the conductive paste layer and connecting the carbon particles of the carbon layer and the conductive metal particles of the conductive paste layer.

A method for manufacturing a solid electrolyte capacitor in accordance with the present invention includes a step of forming a dielectric oxide film layer on a surface of an anode made of a valve metal, a step of forming a solid electrolyte layer on the dielectric oxide film layer, a step of forming a cathode layer on the solid electrolyte layer, a step of electrically connecting a cathode terminal to the cathode layer, and a step of electrically connecting an anode terminal to the anode layer. The cathode layer formation step includes forming a carbon layer containing carbon particles and forming a conductive paste layer containing conductive metal particles and having numerous pores, in that order from the solid electrolyte layer side, and forming a conductive polymer layer formed through the numerous pores of the conductive paste layer and connecting the carbon particles of the carbon layer and the conductive metal particles of the conductive paste layer.

DETAILED DESCRIPTION OF THE INVENTION

In accordance with the present invention, a conductive polymer layer connecting the carbon particles of the carbon layer and the conductive metal particles of the conductive paste layer is formed through the numerous pores of the conductive paste layer, so that the carbon particles and the conductive metal particles can be brought into area contact and fixed.

In the present invention, the thickness of the carbon layer is preferably in the range of 0.1 to 10 μm, and more preferably in the range of 1 to 5 μm. Furthermore, the thickness of the conductive paste layer is preferably in the range of 1 to 50 μm, more preferably in the range of 5 to 30 μm.

In the present invention, it is preferable that a metal layer is further formed on the outer side of the conductive paste layer. Thus, the resistance from the cathode layer to the cathode contact terminal can be lowered even more, so that a solid electrolyte capacitor with an even lower equivalent series resistance can be attained. The thickness of this metal layer is preferably in the range of 0.1 to 20 μm.

It is preferable that the conductive paste layer contains conductive metal particles, a foaming material that foams when subjected to heat, and a resin, and that the pores are a porous structure obtained by foaming the foaming material. Thus, continuous pores can be fabricated easily.

It is preferable that the pores in the conductive paste layer account for 2 to 20 vol % of the volume of the conductive paste layer including the pores. Thus, the equivalent series resistance of the capacitor can be made small.

Figure 1A:
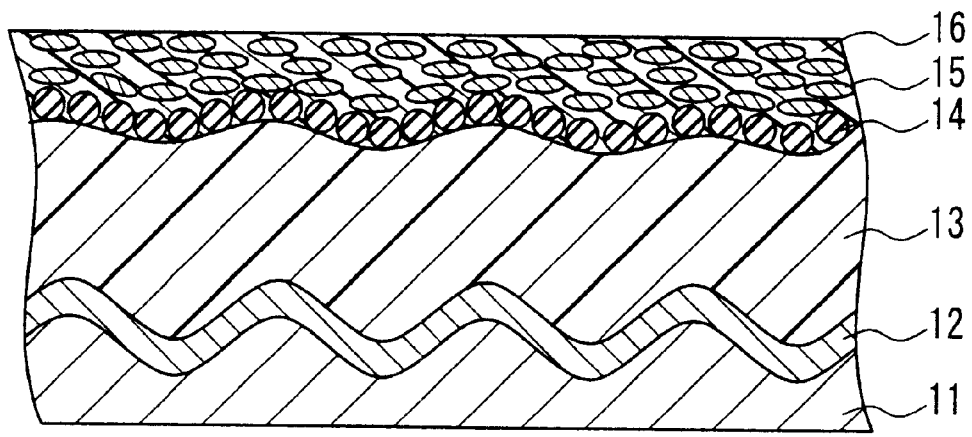
FIG. 1A and FIG. 1B are cross-sectional diagrammatic views of an internal element of an solid electrolyte capacitor in an embodiment of the present invention.
Figure 1B:
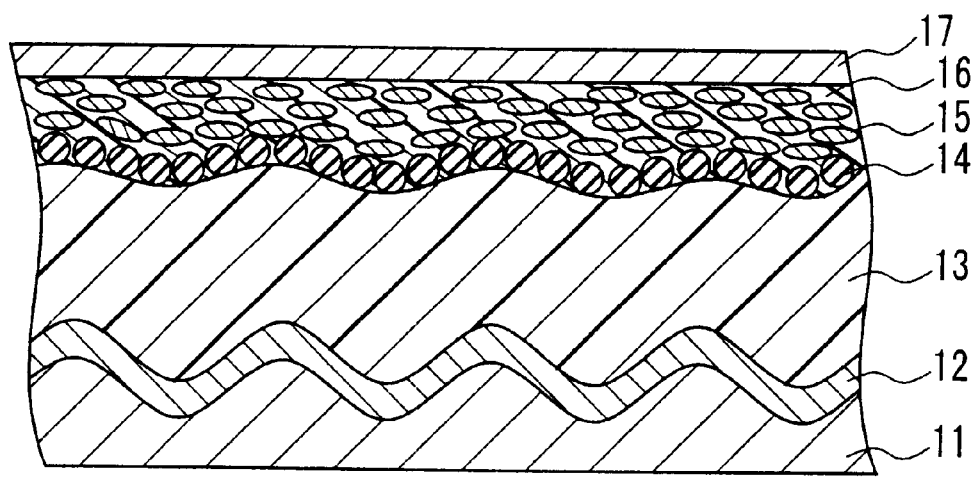
Figure 2:
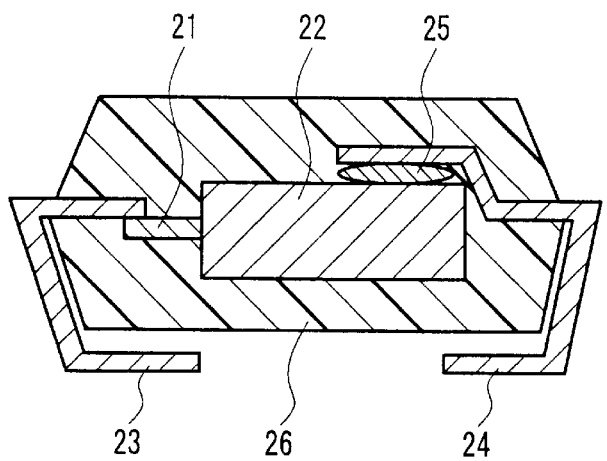
FIG. 2 is a cross-sectional diagrammatic view of a solid electrolyte capacitor with a configuration as in an embodiment of the present invention or in the conventional example.

The following is a detailed explanation of embodiments of the present invention, with reference to the accompanying drawings. FIG. 1A and FIG. 1B are cross-sectional diagrammatic views of an internal element of an solid electrolyte capacitor in an example of the present invention. FIG. 2 is a cross-sectional diagrammatic view of a solid electrolyte capacitor with a configuration as in the present invention or in the conventional example. Referring to these figures, the following is an outline of the manufacturing method.

First, powder of a valve metal, such as tantalum or niobium is formed in a predetermined shape together with a valve metal conductor serving as an anode lead 21, and then the powder is bonded by high-temperature sintering, to produce a sintered body 11 of valve metal. By anodic oxidation of the sintered body 11 in an electrolytic solution, a dielectric oxide film 12 is formed on the surface of the valve metal. Next, a solid electrolyte layer 13 is formed with an electrically conductive polymer such as polypyrrole, polythiophene or polyaniline on the dielectric oxide film 12. For the solid electrolyte layer 13, it is also possible to use manganese dioxide instead of the conductive polymer. The solid electrolyte layer 13 also can be made of several kinds of conductive polymers, or of conductive polymer and manganese dioxide.

Then, the formation of the cathode layer in FIG. 1A is performed as follows. First, a carbon layer 14 made of carbon particles is formed on the solid electrolyte layer 13. Then, a conductive paste layer 15 having numerous pores is formed on the carbon layer 14. Moreover, after forming the conductive paste layer 15 having numerous pores, a cathode layer is formed through the numerous pores of the conductive paste layer 15 and connecting and fixing the carbon particles of the carbon layer 14 and the conductive metal particles of the conductive paste layer 15 with a conductive polymer layer 16, thus forming an internal element 22 of a solid electrolyte capacitor.

The formation of the cathode layer in FIG. 1B is performed as follows. First, a carbon layer 14 made of carbon particles is formed on the solid electrolyte layer 13. Then, a conductive paste layer 15 having numerous pores is formed on the carbon layer 14. Moreover, after forming the conductive paste layer 15 having numerous pores, a cathode layer is formed through the numerous pores of the conductive paste layer 15 and connecting and fixing the carbon particles of the carbon layer 14 and the conductive metal particles of the conductive paste layer 15 with a conductive polymer layer 16, and forming a metal layer 17, thus forming an internal element 22 of a solid electrolyte capacitor.

After the internal element 22 of the solid electrolyte capacitor has been formed, the anode side is connected by welding an anode contact terminal 23 to the anode lead 21, and on the cathode side, the internal element 22 of the solid electrolyte capacitor is connected to a cathode contact terminal 24 with a silver adhesive 25. After this, the entire arrangement is molded with a packaging resin 26. Then, aging is performed, thus producing a solid electrolyte capacitor.

Next, the pores provided in the conductive paste layer 15 are explained. The numerous pores in the conductive paste layer 15 are formed by applying a conductive paste including at least conductive metal particles, a foaming material that foams when subjected to heat, and a resin to the capacitor's internal element on which the carbon layer has been formed, and then foaming the foaming material by the application of heat.

For the conductive metal particles, it is preferable to use at least one kind of metal particles selected from gold particles, silver particles, copper particles, tin particles, indium particles, palladium particles and nickel particles, or any alloy particles of these. If such conductive metal particles with low specific resistance are used, then the equivalent serial resistance of the capacitor can be lowered.

For the foaming material, a foaming resin powder or a foaming inorganic powder that generates pyrolytic gas when subjected to heat is preferable. As the foaming resin powder, for example microcapsules are preferable that include a substance such as low boiling-point hydrocarbons that expand when heated. For the foaming inorganic powder, sodium carbonate monohydrate, sodium hydrogen oxalate monohydrate or the like is preferable. These foaming materials foam near 100° C., which is lower than the formation temperature of the conductive paste layer, so that the numerous pores can be formed easily in the conductive paste layer.

Figure 3A:
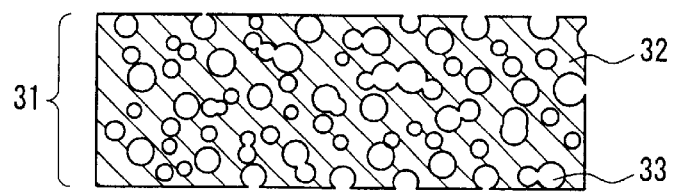
FIG. 3A is a diagrammatic view of a conductive paste layer in accordance with an embodiment of the present invention.
Figure 3B:
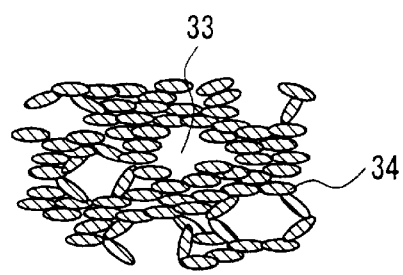
FIG. 3B is an enlarged diagrammatic view of this conductive paste layer.

FIGS. 3A and 3B are diagrammatic views of a conductive paste in accordance with an embodiment of the present invention. As shown in FIG. 3A, the conductive paste layer 31 that has been formed has a structure that is provided with numerous pores 33 inside a structure 32 formed by the conductive metal particles and the resin. As shown in FIG. 3B, in this microstructure, conductive metal particles 34 are linked to a network structure, and the pores 33 formed by foaming the foaming resin powder lead three-dimensionally through the conductive paste layer 31.

Figure 4A:
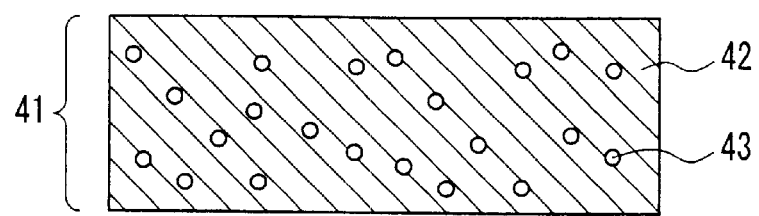
FIG. 4A is a diagrammatic view of the conductive paste layer in the conventional example.
Figure 4B:
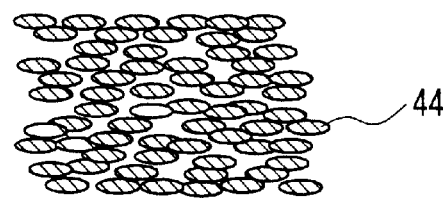
FIG. 4B is an enlarged diagrammatic view of the conductive paste layer in the conventional example.

For comparison, FIGS. 4A and 4B are diagrammatic views of a conductive paste in accordance with the prior art. FIG. 4A shows a conductive paste layer 41 formed using a conductive paste not containing a foaming material. In the formed conductive paste layer 41, there are almost no pores 43 within the structure 42 formed by the conductive metal particles and the resin. As shown in FIG. 4B, since there are almost no pores 43 in this microstructure, the proportion of pores leading through the conductive paste layer 42 is extremely small. Therefore, it is difficult to connect the carbon particles of the carbon layer 14 and the conductive metal particles of the conductive paste layer 15 with the conductive polymer layer 16 through the pores of the conductive paste layer.

Figure 5:
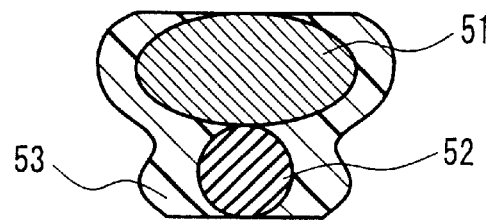
FIG. 5 is an enlarged diagrammatic view of the cathode layer of an internal element of an solid electrolyte capacitor in an embodiment of the present invention.

FIG. 5 shows an enlarged diagrammatic view of the cathode layer of the internal element of a solid electrolyte capacitor in accordance with the present invention. As explained above, to form the cathode layer, a carbon layer and a conductive paste having numerous pores are formed, and then, when a conductive polymer layer is formed from the surface of the conductive paste layer through the numerous pores, the point contact portions of the carbon particles 52 of the carbon layer and the conductive metal particles 51 of the conductive paste layer are surrounded by the conductive polymer 53, so that the effective area of electrical contact can be increased, and the equivalent serial resistance can be decreased.

Examining these results even further, it was found that when the porosity ratio in the conductive paste layer was 2 to 20 vol %, the equivalent series resistance of the capacitor became smaller. In particular, it became clear that the equivalent series resistance became smallest when the porosity ratio of the conductive paste was 10 vol %. The reason for this is that when the porosity ratio of the conductive paste layer is less than 2 vol %, then the polymerization solution for forming the conductive polymer layer becomes hard to impregnate through the pores in the conductive paste layer, and it is difficult to adequately connect the carbon particles of the carbon layer and the conductive metal particles of the conductive paste layer and reinforce the electrical connection. Furthermore, when the porosity ratio of the conductive paste layer is greater than 20 vol %, then the resistance of the conductive paste layer is increased, so that also the equivalent series resistance of the capacitor is increased.

The conductivity of the conductive polymer preferably is at least 5 S/cm. When the conductivity is less than 5 S/cm, then the effect of the reinforcement of the electrical connection between the carbon particles of the carbon layer and the conductive metal particles of the conductive paste layer is small, and it is difficult to lower the equivalent series resistance sufficiently.

Furthermore, if the conductivity of the conductive polymer is sufficiently high, the effect of the reinforcement of the electrical connection between the carbon particles of the carbon layer and the conductive metal particles of the conductive paste layer is high, and a solid electrolyte capacitor with low equivalent series resistance can be obtained, even when the pores in the conductive paste layer are not completely filled up with the conductive polymer layer.

Furthermore, when a metal layer 17 with a resistance that is lower than that of the conductive paste layer with the numerous pores is formed as the outermost layer of the internal element 22 of the solid electrolyte capacitor as shown in FIG. 1B, then the resistance from the cathode layer to the cathode contact terminal is lowered even further, so that a solid electrolyte capacitor with an even lower equivalent series resistance can be obtained.

It is preferable that the metal layer is at least one metal layer selected from metal plated layers, metal layers formed by vapor deposition, and conductive paste layers including conductive metal particles and resin. A preferable thickness for this case is 0.1 to 20 $\mu$m.

Furthermore, the conductive metal particles can be at least one kind of metal particles selected from gold particles, silver particles, copper particles, tin particles, indium particles, palladium particles and nickel particles, or any alloy particles of these. A preferable thickness for this case is 1 to 50 $\mu$m.

Next, the connection of the internal element 22 of the solid electrolyte capacitor and the cathode contact terminal 24 is explained. When the carbon particles of the carbon layer 14 and the conductive metal particles of the conductive paste layer 15 are connected by the conductive polymer layer 16, the conductive polymer layer 16 is not only formed in the pores of the conductive paste layer 15 and the carbon layer 14, but also on the surface of the conductive paste layer 15. Thus, if, on the surface of the internal element 22 of the solid electrolyte capacitor, the conductive polymer layer is formed at the place at which the cathode contact terminal 24 is electrically connected with the silver adhesive 25, then the equivalent series resistance increases. Therefore, it is necessary to suppress the formation of the conductive polymer layer 16 at the interface between the silver adhesive 25 and the surface of the internal element 22 of the solid electrolyte capacitor that is electrically connected by the silver adhesive.

Figure 6:
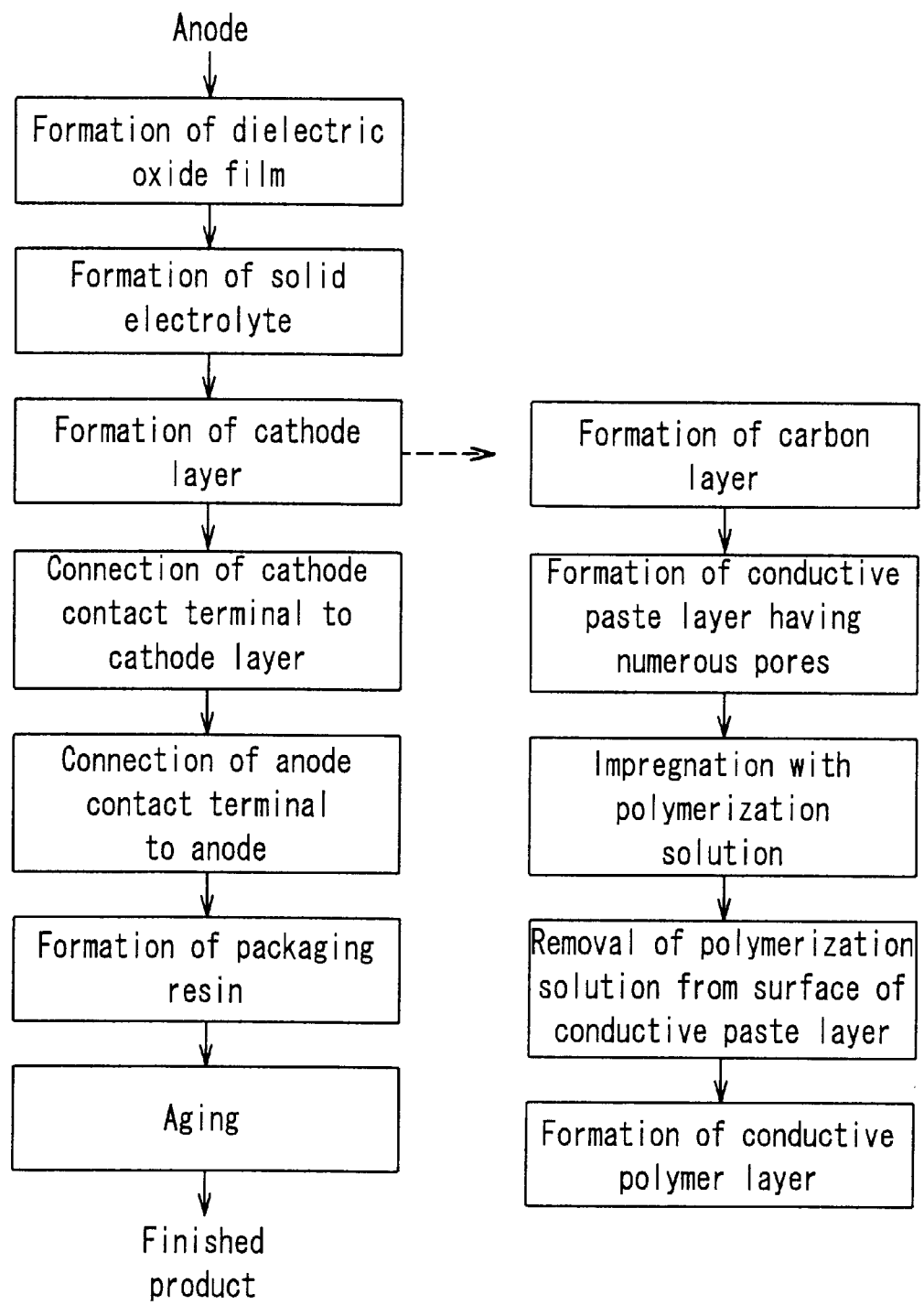
FIG. 6 is a first flowchart of a method for manufacturing a solid electrolyte capacitor in an embodiment of the present invention.

A first manufacturing method for this is explained in the following. FIG. 6 is a flowchart of this first manufacturing method. In this first manufacturing method, chemical polymerization using a polymerization solution at least including the ingredient monomers for the conductive polymer and oxidizer is used for the formation method of the conductive polymer layer. "Conductive polymer" means for example polypyrrole, polythiophene, polyaniline or the like, whereas "ingredient monomers" means for example pyrrole, thiophene, aniline or the like. Furthermore, "oxidizer" means for example ferric compounds, cupric compounds, ammonium persulfate, hydrogen peroxide or the like, and it is preferable to add the oxidizer in an amount of 0.5 to 2 times the mol amount of the ingredient monomers.

To form the cathode layer of the present invention, first a carbon layer and a conductive paste layer having numerous pores are formed on a solid electrolyte layer. Next, the polymerization solution is impregnated through the pores in the conductive paste layer. If the polymerization solution is impregnated under reduced pressure, then the polymerization solution can be caused to penetrate the pores in the conductive paste layer in a short time. After the polymerization solution has impregnated the pores of the conductive paste layer, a gas, such as compressed air, is blown over the surface of the conductive paste layer to remove the polymerization solution. After the polymerization solution has been removed, the reaction between the monomers and the oxidizer is accelerated by applying heat or the like, and the conductive polymer layer is formed. By removing the polymerization solution from the surface of the conductive paste layer after the polymerization solution has been impregnated in this manner, and then letting the polymerization reaction proceed for example by application of heat to form the conductive polymer layer, the formation of the conductive polymer layer on the surface of the internal element of the solid electrolyte capacitor electrically connected to the cathode contact terminal can be suppressed, while at the same time reinforcing the electrical connection between the carbon particles of the carbon layer and the conductive metal particles of the conductive paste layer.

Figure 7:
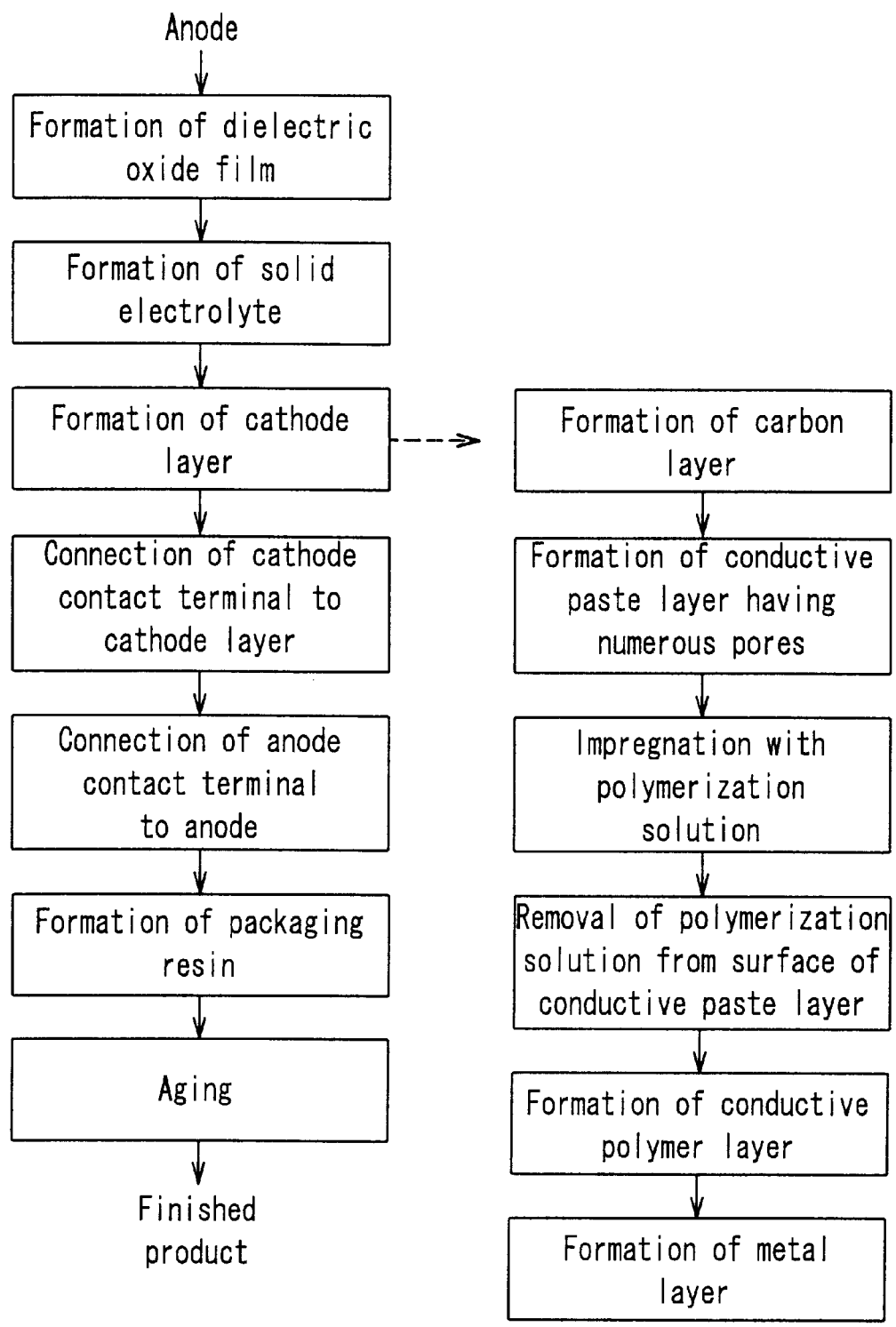
FIG. 7 is a first flowchart of a method for manufacturing a solid electrolyte capacitor in an embodiment of the present invention.

If, as shown in FIG. 7, after forming the conductive polymer layer of the cathode layer, a metal layer, whose resistance is lower than that of the conductive paste layer having numerous pores, is formed on the outermost layer of the internal element of the solid electrolyte capacitor, then the resistance from the cathode layer to the cathode contact terminal is made even lower, so that a solid electrolyte capacitor with an even lower equivalent series resistance can be attained. The metal layer 17 can be made by metal plating, vapor deposition, sputtering or the like, or it can be made of a conductive paste layer or the like.

It should be noted that the polymerization solution also can be removed from the surface of the conductive paste layer by physically wiping the polymerization solution off the surface of the conductive paste layer.

Figure 8:
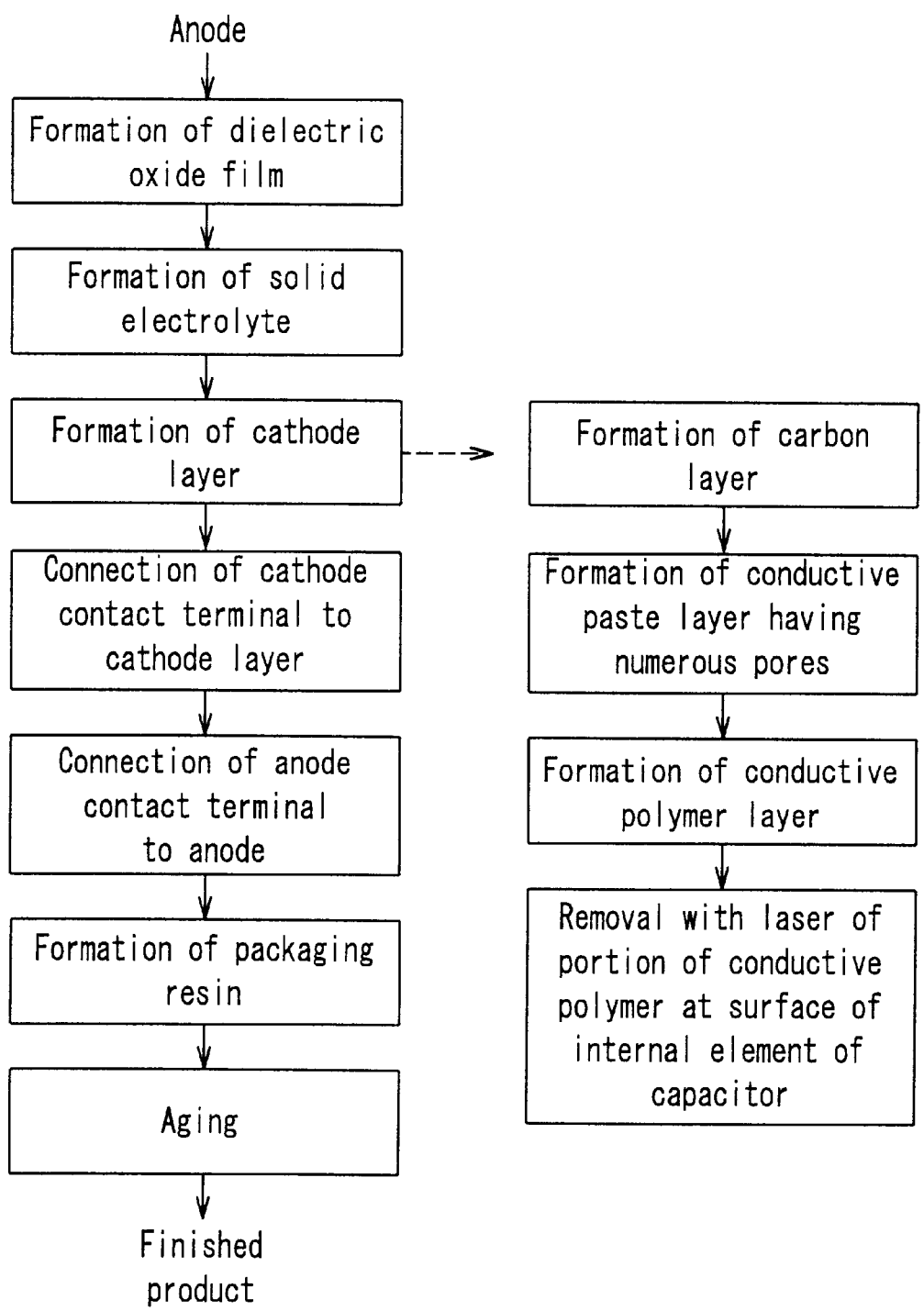
FIG. 8 is a second flowchart of a method for manufacturing a solid electrolyte capacitor in an embodiment of the present invention.

The following is an explanation of a second manufacturing method suppressing the formation of a conductive polymer layer on the surface of the internal element of the solid electrolyte capacitor that is electrically connected to the cathode contact terminal. A flowchart of this second manufacturing method is shown in FIG. 8.

As the cathode layer formation method of the present invention, first a carbon layer and a conductive paste layer having numerous pores are formed on a solid electrolyte layer. Then, a conductive polymer layer is formed through the numerous pores in the conductive paste layer. After forming the conductive polymer layer, at least the conductive polymer layer at the position that is electrically connected to the cathode contact terminal is removed by irradiating a laser onto the conductive polymer layer formed on the surface of the internal element of the solid electrolyte capacitor. Thus, it is possible to suppress the formation of the conductive polymer layer on the surface of the solid electrolyte capacitor that is electrically connected to the cathode contact terminal.

Figure 9:
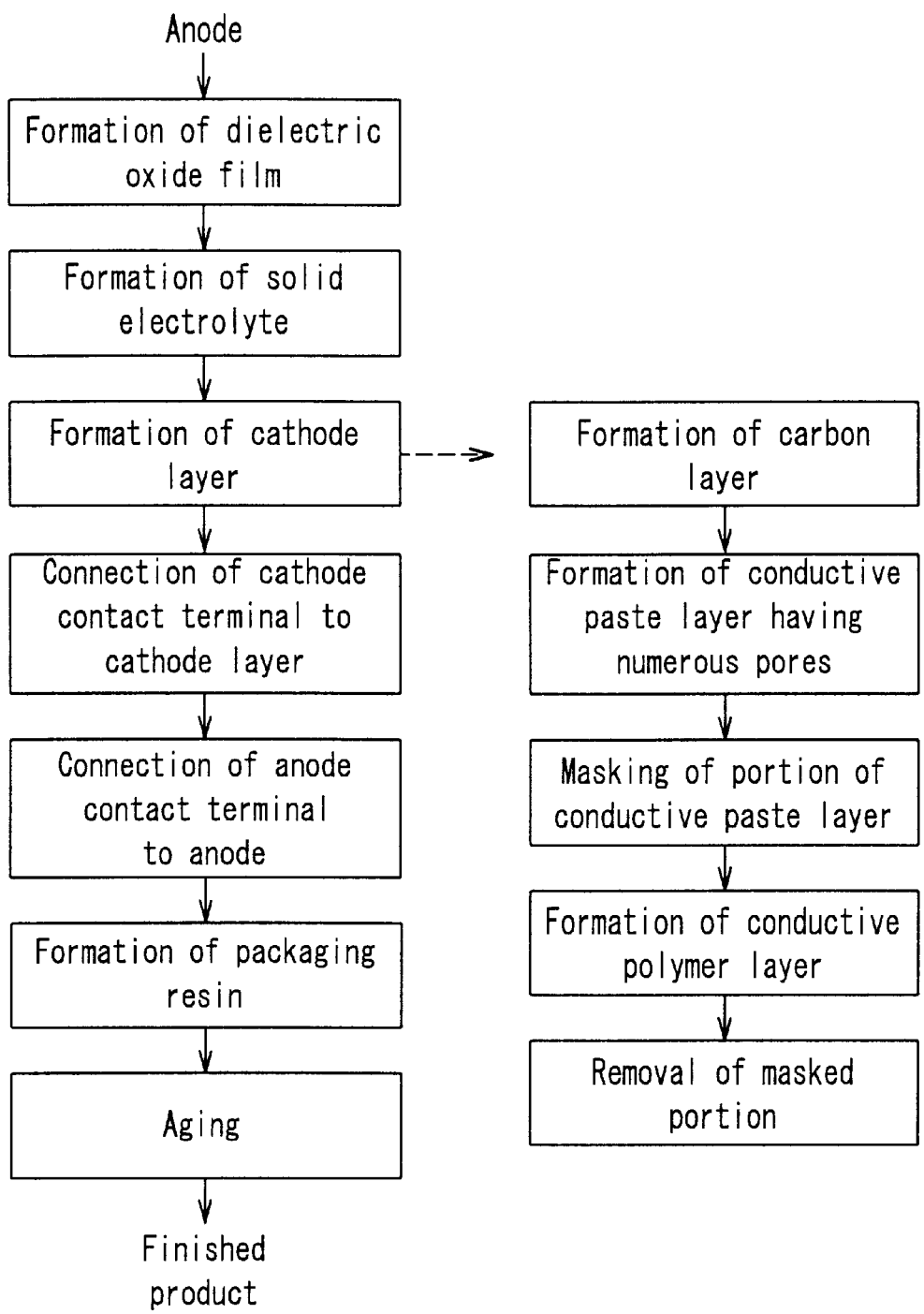
FIG. 9 is a third flowchart of a method for manufacturing a solid electrolyte capacitor in an embodiment of the present invention.

The following is an explanation of a third manufacturing method suppressing the formation of a conductive polymer layer on the surface of the internal element of the solid electrolyte capacitor that is electrically connected to the cathode contact terminal. A flowchart of this third manufacturing method is shown in FIG. 9.

As the cathode layer formation method of the present invention, first a carbon layer and a conductive paste layer having numerous pores are formed on a solid electrolyte layer. Then, at least that position on the surface of the internal element of the solid electrolyte capacitor that is electrically connected to the cathode contact terminal is masked using a photoresist or the like. Next, a conductive polymer layer is formed through the numerous pores in the conductive paste layer, and after that, the masking material is removed from the portion that had been masked in the previous step. Thus, it is possible to suppress the formation of the conductive polymer layer on the surface of the internal element of the solid electrolyte capacitor that is electrically connected to the cathode contact terminal.

Figure 10:
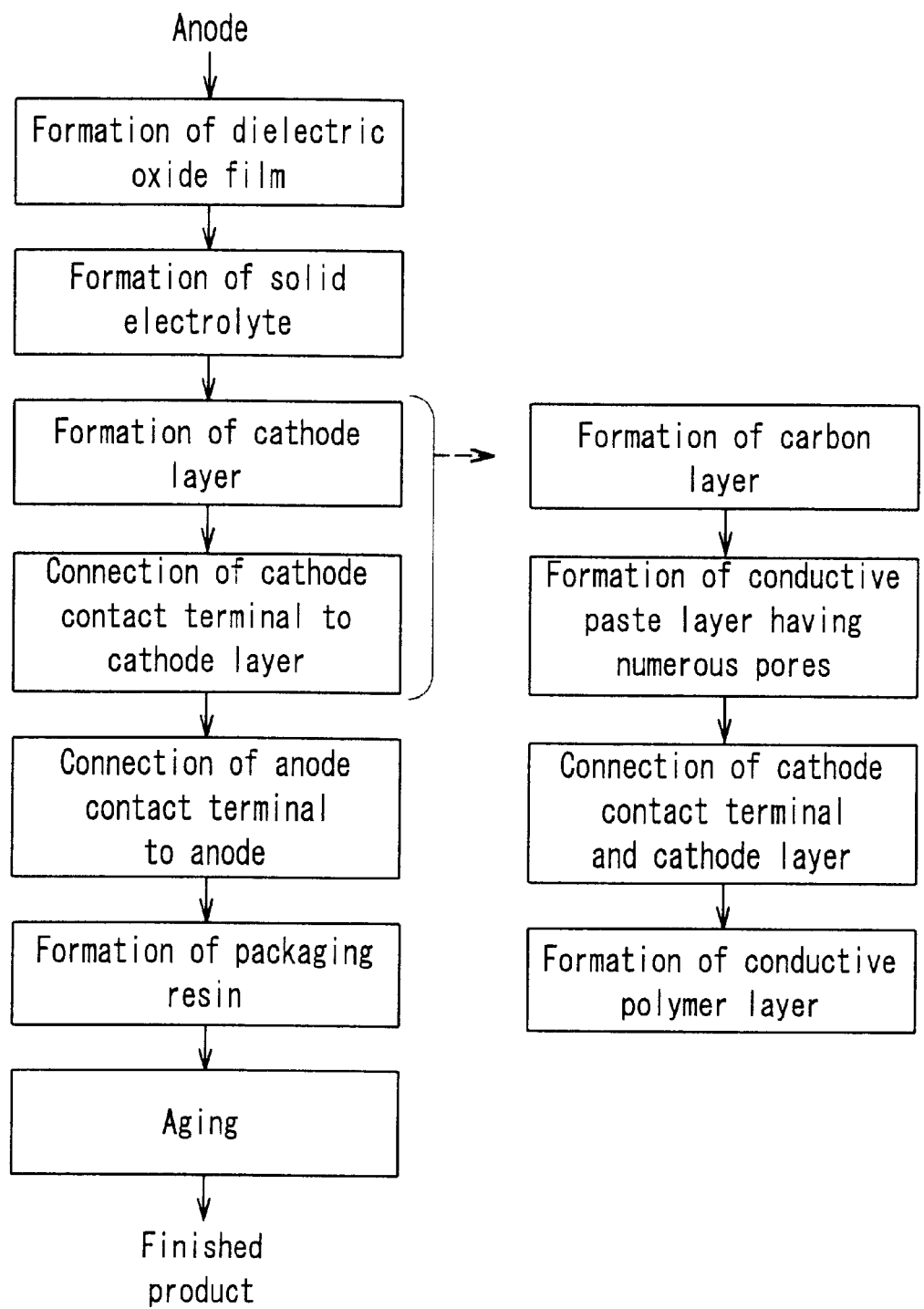
FIG. 10 is a fourth flowchart of a method for manufacturing a solid electrolyte capacitor in an embodiment of the present invention.

The following is an explanation of a fourth manufacturing method suppressing the formation of a conductive polymer layer on the surface of the internal element of the solid electrolyte capacitor that is electrically connected to the cathode contact terminal. A flowchart of this fourth manufacturing method is shown in FIG. 10.

As the cathode layer formation method of the present invention, first a carbon layer and then a conductive paste layer having numerous pores are formed on a solid electrolyte layer. Then, the conductive paste layer and the cathode contact terminal are electrically connected. After that, a conductive polymer layer is formed through the numerous pores in the conductive paste layer. Thus, since the conductive polymer layer is formed after the cathode contact terminal and the internal element of the solid electrolyte capacitor have been connected by silver adhesive, the formation of the conductive polymer layer on the surface of the internal element of the solid electrolyte capacitor that is electrically connected to the cathode contact terminal can be suppressed.

In the second to fourth manufacturing methods suppressing the formation of a conductive polymer layer on the surface of the internal element of the solid electrolyte capacitor that is electrically connected to the cathode contact terminal, the method for forming the conductive polymer layer is not limited to chemical polymerization using a polymerization solution including the monomers and an oxidizer, but if chemical polymerization is used as the method for forming the conductive polymer layer, then the polymerization solution can be caused to penetrate through the pores of the conductive paste layer in a short time when the polymerization solution is impregnated under reduced pressure.

As described above, the present invention provides a solid electrolyte capacitor with small equivalent series resistance and a method for manufacturing the same by forming a carbon layer and a conductive paste layer having numerous pores as the cathode layer of an internal element of a solid electrolyte capacitor, and forming a conductive polymer layer through the pores of the conductive paste layer.

It should be noted that "conductive polymer layer formed through the numerous pores of the conductive paste layer" means a material in which a conductive polymer has been introduced from the surface side of the conductive paste layer having numerous pores.

EXAMPLES

The following is an explanation of specific working examples of the present invention.

Working Example 1

As the foaming resin powder, microcapsules (by Matsumoto Yushi Seiyaku Co., Ltd; tradename "MICROPEAL")

were prepared that have a structure of low boiling point hydrocarbons filled into hollow resin particles. These microcapsules foam near 100° C. and their average particle diameter before foaming is not greater than 3 μm. The microcapsules were added to commercial silver paste (containing 3 to 10 parts by weight of epoxy resin per 100 parts by weight of silver particles) at a volume ratio microcapsules:silver of 0.002:1, thus obtaining a silver paste 1. The same microcapsules as for the silver paste 1 were prepared and added to commercial silver paste at a volume ratio microcapsules:silver of 0.0004:1, thus obtaining a silver paste 2. The same microcapsules as for the silver paste 1 were prepared and added to commercial silver paste at a volume ratio microcapsules:silver of 0.004:1, thus obtaining a silver paste 3. The same microcapsules as for the silver paste 1 were prepared and added to commercial silver paste at a volume ratio microcapsules:silver of 0.006:1, thus obtaining a silver paste 4.

Sodium carbonate monohydrate was prepared as a foaming inorganic powder. This sodium carbonate monohydrate was given to commercial silver paste at a volume ratio microcapsules:silver of 0.01:1, thus obtaining a silver paste 5. Furthermore, sodium hydrogen oxalate monohydrate was prepared as a foaming inorganic powder. This sodium hydrogen oxalate monohydrate was added to commercial silver paste at a volume ratio microcapsules:silver of 0.01:1, thus obtaining a silver paste 6.

For comparison, a commercial silver paste without any additives was used as a silver paste 7. After the silver pastes 1 to 7 prepared as described above were applied to glass sheets to a thickness of about 50 μm, they were dried for about 30 min at 100° C. while simultaneously foaming the foaming material, and then dried for a further 30 min at 180° C., forming silver paste layers having numerous pores on the glass sheets.

Working Example 2

For the polymerization solution for forming the conductive polymer, 140 g of 3,4-ethylenedioxythiophene serving as the monomers, 1100 g of iron (III) p-toluenesulfonate serving as oxidizer and dopant, and 1000 g 1-butanol were mixed, thus obtaining a polymerization solution 1. In order to adjust the conductivity of the conductive polymer layer, 2 vol % cellulose was added to the polymerization solution 1, thus obtaining a polymerization solution 2.

The polymerization solutions 1 and 2 prepared as described above were applied to a glass sheet to a thickness of about 10 μm, and then the temperature was gradually increased from room temperature to 150° C., polymerizing the 3,4-ethylenedioxythiophene. After the polymerization, it was rinsed for 10 min with pure water, and then dried for 10 min at 105° C., thus forming conductive polymer layers on a glass sheet.

Working Example 3

A tantalum sintered body of 1.0 mm length, 3.2 mm width and 4.4 mm height was made, and a dielectric oxide film layer was formed at a formation voltage of 15 V in an aqueous phosphate solution, thus obtaining a porous body for a capacitor.

Pyrrole was dissolved in an aqueous solution containing 10 vol % isopropyl alcohol to 1.0 mol/L, thus obtaining a monomer solution. In an aqueous solution containing 10 vol % isopropyl alcohol, iron (III) sulfate was dissolved to 0.25 mol/L as the oxidizer, and, as a dopant, alkylnaphthalenesulfonate ions in form of Na salt were dissolved at 0.03 mol/L, thus obtaining an oxidizer solution.

The porous body was dipped into the monomer solution, and then lifted out of it and dipped into the oxidizer solution to perform polymerization. Then, it was rinsed for 10 min with 80° C. pure water, and dried for 10 min at 105° C. This operation was repeated several times, thus obtaining a solid electrolyte layer made of polypyrrole.

After the solid electrolyte layer has been formed, it was soaked for 3 min in a solution of carbon particles, and then dried for 30 min at 120° C., thus forming a carbon layer. After forming the carbon layer, the silver paste 1 prepared in Working Example 1 was applied on the carbon layer, dried for 30 min at 100° C., and dried for a further 30 min at 180° C., thus forming a silver paste layer having numerous pores.

After the silver paste layer has been formed, the internal element formed up to the silver paste layer was soaked for 10 min under reduced pressure in the polymerization solution 1 prepared in Working Example 2, and the numerous pores in the silver paste layer were impregnated with polymerization solution. After the impregnation with the polymerization solution, the internal element was retrieved from the polymerization solution, compressed air was blown over the surface of the internal element, and the polymerization solution adhering to the surface of the internal element was removed. After this, the temperature of the internal element was gradually increased from room temperature to 150° C., and the 3,4-ethylenedioxythiophene was polymerized. After the polymerization, it was rinsed with pure water for 10 min, and dried for 10 min at 105° C., thus forming a conductive polymer layer.

After that, on the anode side, the anode lead and the anode contact terminal were joined together by welding, and on the cathode side, the internal element of the solid electrolyte capacitor and the cathode contact terminal were connected by silver adhesive, and then the entire arrangement was molded with a packaging resin. Then, aging was performed, thus producing a solid electrolyte capacitor.

Working Example 4

A solid electrolyte capacitor was fabricated in the same manner as in Working Example 3, except that the silver paste 2 prepared in Working Example 1 was used for the cathode layer formation.

Working Example 5

A solid electrolyte capacitor was fabricated in the same manner as in Working Example 3, except that the silver paste 3 prepared in Working Example 1 was used for the cathode layer formation.

Working Example 6

A solid electrolyte capacitor was fabricated in the same manner as in Working Example 3, except that the silver paste 4 prepared in Working Example 1 was used for the cathode layer formation.

Working Example 7

A solid electrolyte capacitor was fabricated in the same manner as in Working Example 3, except that the silver paste 5 prepared in Working Example 1 was used for the cathode layer formation.

Working Example 8

A solid electrolyte capacitor was fabricated in the same manner as in Working Example 3, except that the silver paste 6 prepared in Working Example 1 was used for the cathode layer formation.

Working Example 9

A solid electrolyte capacitor was fabricated in the same manner as in Working Example 3, except that the polymerization solution 2 prepared in Working Example 2 was used for the conductive polymer layer formation.

Working Example 10

An internal element of a solid electrolyte capacitor was fabricated in the same manner as in Working Example 3, and then an electroless silver plating layer was formed on the outermost layer.

Then, a solid electrolyte capacitor was fabricated in the same manner as in Working Example 3.

Working Example 11

An internal element of a solid electrolyte capacitor was fabricated in the same manner as in Working Example 3, and then a gold vapor deposition layer was formed on the outermost layer.

Then, a solid electrolyte capacitor was fabricated in the same manner as in Working Example 3.

Working Example 12

An internal element of a solid electrolyte capacitor was fabricated in the same manner as in Working Example 3, and then a silver paste layer was formed on the outermost layer, using commercial silver paste not containing a foaming resin powder.

Then, a solid electrolyte capacitor was fabricated in the same manner as in Working Example 3.

Working Example 13

An internal element of a solid electrolyte capacitor was formed up to the conductive paste layer under the same conditions as in Working Example 3.

Then, after impregnation with the polymerization solution for forming a conductive polymer layer as in Working Example 3, the conductive polymer layer was formed without removing the polymerization solution from the element surface. After this, the surface portion of the internal element of the solid electrolyte capacitor that is electrically connected to the cathode contact terminal using silver adhesive was irradiated with a YAG laser, and the conductive polymer layer formed on the conductive paste layer was removed. Then, a solid electrolyte capacitor was fabricated in the same manner as in Working Example 3.

Working Example 14

An internal element of a solid electrolyte capacitor was formed up to the conductive paste layer under the same conditions as in Working Example 3. Also, a novolac-based positive resist was prepared as a photoresist.

Then, the photoresist was applied to the surface portion of the internal element of the solid electrolyte capacitor that is electrically connected to the cathode contact terminal using silver adhesive, then dried, exposed, and developed, thus masking one portion of the surface of the internal element of the solid electrolyte capacitor. After this, it was impregnated, as in Working Example 3, with polymerization solution for forming a conductive polymer layer, and then the conductive polymer layer was formed without removing the polymerization solution from the element surface. Furthermore, the photoresist on the portion that had been masked with photoresist in the previous step was dissolved and removed, and a solid electrolyte capacitor was fabricated in the same manner as in Working Example 3.

Working Example 15

An internal element of a solid electrolyte capacitor was formed up to the conductive paste layer under the same conditions as in Working Example 3. Also, the same anode contact terminal and cathode contact terminal as in Working Example 3 were prepared.

The anode side of the internal element of the solid electrolyte capacitor formed up to the conductive paste layer was connected by welding the anode contact terminal to the anode lead, and on the cathode side, the internal element of the solid electrolyte capacitor was connected to the cathode contact terminal with silver adhesive.

Next, after impregnation with the polymerization solution for forming the conductive polymer layer as in Working Example 3, the internal element connected to the anode and the cathode contact terminals was retrieved from the polymerization solution, and compressed air was blown over the anode and the cathode contact terminals to remove adhering polymerization solution, thus forming the conductive polymer layer. After this, the entire arrangement was molded with a packaging resin, and aging was performed, thus producing a solid electrolyte capacitor.

Comparative Example 1

For comparison with the present invention, an internal element of a solid electrolyte capacitor was formed up to the conductive paste layer as in Working Example 3, but using the silver paste 7 prepared in Working Example 1. Then, a solid electrolyte capacitor was fabricated without forming the conductive polymer layer.

The porosity ratio of the silver paste layers on the glass sheets fabricated in Working Example 1 was measured by mercury penetration using a Micromeritics Automatic Porosimeter by Shimadzu Corporation. The results are shown in Table 1:

TABLE 1

| silver paste number | porosity ratio of silver paste layer (vol %) |
| --- | --- |
| silver paste 1 | 10 |
| silver paste 2 | 2 |
| silver paste 3 | 20 |
| silver paste 4 | 30 |
| silver paste 5 | 15 |
| silver paste 6 | 16 |
| silver paste 7 | 0.5 |

The conductivity of the conductive polymer layers on the glass sheet fabricated in Working Example 2 was measured by the four probe method using a Loresta SP by Mitsubishi Petrochemical Co., Ltd. The results are shown in Table 2:

TABLE 2

| polymerization solution number | conductivity of conductive polymer layer (S/cm) |
| --- | --- |
| polymerization solution 1 | 5 |
| polymerization solution 2 | 1 |

The equivalent series resistance at 100 kHz of the solid electrolyte capacitors obtained from the Working Examples 3 to 14 and Comparative Example 1 was measured. Mea surements were performed on 20 samples for each example. Table 3 shows the average values.

TABLE 3

| example number | equivalent series resistance (mΩ) |
|---|---|
| Working Example 3 | 20 |
| Working Example 4 | 25 |
| Working Example 5 | 28 |
| Working Example 6 | 45 |
| Working Example 7 | 23 |
| Working Example 8 | 24 |
| Working Example 9 | 32 |
| Working Example 10 | 15 |
| Working Example 11 | 15 |
| Working Example 12 | 17 |
| Working Example 13 | 21 |
| Working Example 14 | 23 |
| Working Example 15 | 28 |
| Comparative Example 1 | 40 |

As becomes clear from Table 3, the solid electrolyte capacitors of Working Examples 3 to 5 and 7 to 15 have a smaller equivalent series resistance than Comparative Example 1. This is because in Comparative Example 1, the carbon particles of the carbon layer and the conductive metal particles of the conductive paste layer are in point contact, thus increasing the interface resistance between the carbon layer and the conductive paste layer. On the other hand, in Working Examples 3 to 5 and 7 to 15, the electrical connection between the carbon particles of the carbon layer and the conductive metal particles of the conductive paste layer is reinforced by linking them with the conductive polymer, thus decreasing the interface resistance between the carbon layer and the conductive paste layer.

Looking at the porosity ratios of the silver paste layers in Table 1, it can be seen that when the porosity ratio is 2 to 20 vol %, the equivalent series ratio of the capacitors becomes small. When the porosity ratio of the silver paste layer is 10 vol %, then the equivalent series resistance is smallest. This is because when the porosity ratio of the silver paste layer is less than 2 vol % as in Comparative Example 1, then the polymerization solution for forming the conductive polymer layer is not impregnated through the pores, so that it becomes difficult to reinforce the electrical connection between the carbon particles of the carbon layer and the silver particles of the silver paste layer with the conductive polymer layer.

Furthermore, when the porosity ratio of the silver paste layer exceeds 20 vol % as in Working Example 6, then the resistance of the silver paste layer becomes large, so that the equivalent series resistance also becomes large.

Comparing Working Example 3 with Working Example 9, it can be seen that the equivalent series resistance of Working Example 3 is smaller. This is because, as shown in FIG. 2, the conductivity of the conductive polymer formed with the polymerization solution 1 used in Working Example 3 is higher than that of the conductive polymer formed with the polymerization solution 2 used in Working Example 9. Therefore, the effect of the reinforcement of the electrical connection between the carbon particles of the carbon layer and the conductive metal particles of the conductive paste layer becomes greater.

Comparing Working Example 3 with Working Examples 10 to 12, it can be seen that the equivalent series resistance of Working Examples 10 to 12 is lower. This is because the outermost layer of the internal element of the solid electrolyte capacitor has been covered with a metal layer whose resistance is lower than that of the conductive paste layer having numerous pores used for the cathode layer.

It should be noted that in these working examples, tantalum was used for the valve metal of the anode, but there is no limitation to this, and the same effect also can be attained using, for example, niobium or aluminum for the anode. Furthermore, in these working examples, a block-shaped sintered body was used as the structure of the anode, but there is no limitation to this, and the structure of the anode may also be an etched foil or a sheet-shaped sintered body.

Furthermore, in these working examples, polypyrrole, which is a conductive polymer, was used for the solid electrolyte, but there is no limitation to this, and it is also possible to use another conductive polymer. For the solid electrolyte, it is also possible to use manganese dioxide instead of a conductive polymer. It is further possible to attain the same effect when using several kinds of conductive polymers, or conductive polymer and manganese dioxide.

Furthermore, in these working examples, polyethylenedioxy-thiophene was used for the conductive polymer layer, but there is no limitation to this, and it is also possible to use another conductive polymer.

Furthermore, in these working examples, silver particles were used for the conductive metal particles, but it is also possible to attain the same effect when using at least one kind of metal particles selected from gold particles, copper particles, tin particles, indium particles, palladium particles and nickel particles, or any alloy particles of these.

Furthermore, in these working examples, an electroless silver plating layer, a gold vapor deposition layer or a silver paste layer was used for the metal layer, but there is no limitation to these, and the same effect also can be attained when using an electroless plating layer of another metal, an electroplating layer, a metal layer formed by sputtering, or a layer of another conductive paste.

Furthermore, in these working examples, a novolac-based positive photoresist was used for the material masking a portion of the surface of the internal element of the solid electrolyte capacitor, but the same effect also can be attained as long as it is a material that can mask a portion of the surface of the internal element of the solid electrolyte capacitor when forming the conductive polymer layer, and that can be easily removed after the conductive polymer layer has been formed.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A solid electrolyte capacitor, comprising:
    an anode made of a valve metal on whose surface a dielectric oxide film layer is formed;
    a solid electrolyte layer formed on the dielectric oxide film layer;
    a cathode layer formed on the solid electrolyte layer;
    a cathode contact terminal electrically connected to the cathode layer; and
    an anode contact terminal electrically connected to the anode layer;

wherein the cathode layer comprises a carbon layer comprising carbon particles, and a conductive paste layer comprising conductive metal particles and having numerous pores, formed in that order from the solid electrolyte layer side; and which further comprises a conductive polymer layer formed through the numerous pores of the conductive paste layer and connecting the carbon particles of the carbon layer and the conductive metal particles of the conductive paste layer.

2. The solid electrolyte capacitor according to claim 1, further comprising a metal layer formed on the outer side of the conductive paste layer.

3. The solid electrolyte capacitor according to claim 1, wherein the conductive paste layer comprises conductive metal particles, a foaming material that foams when subjected to heat, and a resin, wherein said pores are obtained by foaming the foaming material.

4. The solid electrolyte capacitor according to claim 1, wherein the porosity ratio of the conductive paste layer is 2 to 20 vol % of the conductive paste layer including the pores.

5. The solid electrolyte capacitor according to claim 3, wherein the foaming material is a foaming resin powder.

6. The solid electrolyte capacitor according to claim 5, wherein the foaming resin powder comprises microcapsules that contain, inside hollow resin particles, a substance that expands when subjected to heat.

7. The solid electrolyte capacitor according to claim 6, wherein the substance that expands when subjected to heat is low boiling point hydrocarbons.

8. The solid electrolyte capacitor according to claim 3, wherein the foaming material is a foaming inorganic powder generating pyrolytic gas when subjected to heat.

9. The solid electrolyte capacitor according to claim 8, wherein the foaming inorganic powder is at least one hydrate compound selected from sodium carbonate monohydrate and sodium hydrogen oxalate monohydrate.

10. The solid electrolyte capacitor according to claim 1, wherein the conductivity of the conductive polymer layer is at least 5 S/cm.

11. The solid electrolyte capacitor according to claim 2, wherein the metal layer is at least one selected from gold plating layers, metal layers formed by vapor deposition, and conductive paste layers containing conductive metal particles and resin.

12. The solid electrolyte capacitor according to claim 1, wherein the conductive metal particles are at least one kind of metal particles selected from gold particles, silver particles, copper particles, tin particles, indium particles, palladium particles and nickel particles, or any alloy particles of these.

13. A method for manufacturing a solid electrolyte capacitor, comprising:

forming a dielectric oxide film layer on a surface of an anode made of a valve metal;

forming a solid electrolyte layer on the dielectric oxide film layer;

forming a cathode layer on the solid electrolyte layer;

electrically connecting a cathode terminal to the cathode layer; and electrically connecting an anode terminal to the anode layer;

wherein the cathode layer formation step comprises forming a carbon layer comprising carbon particles and forming a conductive paste layer comprising conductive metal particles and having numerous pores, in that order from the solid electrolyte layer side, and forming a conductive polymer layer through the numerous pores of the conductive paste layer and connecting the carbon particles of the carbon layer and the conductive metal particles of the conductive paste layer.

14. The method for manufacturing a solid electrolyte capacitor according to claim 13, further comprising forming a metal layer after forming the conductive paste layer.

15. The method for manufacturing a solid electrolyte capacitor according to claim 13, wherein the step of forming the conductive polymer layer is a chemical polymerization using a polymerization solution comprising ingredient monomers of the conductive polymer and an oxidizer, comprising:

impregnating the pores in the conductive paste layer with the polymerization solution;

removing the polymerization solution from the surface of the conductive paste layer after the pores in the conductive paste layer have been impregnated with the polymerization solution;

applying heat after the polymerization solution has been removed from the surface of the conductive paste layer.

16. The method for manufacturing a solid electrolyte capacitor according to claim 15, wherein the step of impregnating the pores in the conductive paste layer with the polymerization solution is performed under reduced pressure.

17. The method for manufacturing a solid electrolyte capacitor according to claim 15, wherein the step of removing the polymerization solution from the surface of the conductive paste layer comprises blowing compressed air over the surface of the conductive paste layer to remove the polymerization solution.

18. The method for manufacturing a solid electrolyte capacitor according to claim 13, wherein the step of forming the cathode layer comprises, in the following order:

forming the carbon layer;

forming the conductive paste layer having numerous pores;

forming the conductive polymer layer connecting the carbon particles of the carbon layer and the conductive metal particles of the conductive paste layer simultaneously in the numerous pores and at the surface of the conductive paste layer; and irradiating with laser light the conductive polymer layer formed on the conductive paste layer at a portion corresponding to a position at which the cathode contact terminal is formed, and removing it.

19. The method for manufacturing a solid electrolyte capacitor according to claim 13, wherein the step of forming the cathode layer comprises, in the following order:

forming the carbon layer;

forming the conductive paste layer having numerous pores;

masking a portion of the surface of the conductive paste layer that corresponds to a position at which the cathode contact terminal is connected;

forming the conductive polymer layer connecting the carbon particles of the carbon layer and the conductive metal particles of the conductive paste layer simultaneously in the numerous pores and at the surface of the conductive paste layer; and removing the masked portion of the surface of the conductive paste layer.

20. The method for manufacturing a solid electrolyte capacitor according to claim 13,
wherein the step of forming the cathode layer comprises, in the following order:
forming the carbon layer;
forming the conductive paste layer having numerous pores;
electrically connecting the conductive paste layer and the cathode contact terminal; and
forming the conductive polymer layer connecting the carbon particles of the carbon layer and the conductive metal particles of the conductive paste layer simultaneously in the numerous pores and at the surface of the conductive paste layer.

21. The method for manufacturing a solid electrolyte capacitor according to claim 18,
wherein the step of forming the conductive polymer layer is a chemical polymerization using a polymerization solution comprising monomers and an oxidizer, comprising:
impregnating the pores in the conductive paste layer with the polymerization solution; and
applying heat after the pores in the conductive paste layer have been impregnated with the polymerization solution.

22. The method for manufacturing a solid electrolyte capacitor according to claim 21, wherein the step of impregnating the pores in the conductive paste layer with the polymerization solution is performed under reduced pressure.

23. The method for manufacturing a solid electrolyte capacitor according to claim 13, wherein the step of forming the conductive paste layer having the numerous pores includes a step of applying a conductive paste containing conductive metal particles, a foaming material that foams when subjected to heat, and a resin, and applying heat to and foaming the foaming material to form the pores.

* * * * *